United States Patent [19]

Todorov et al.

[11] Patent Number: 5,801,386
[45] Date of Patent: Sep. 1, 1998

[54] APPARATUS FOR MEASURING PLASMA CHARACTERISTICS WITHIN A SEMICONDUCTOR WAFER PROCESSING SYSTEM AND A METHOD OF FABRICATING AND USING SAME

[75] Inventors: Valentin N. Todorov, Fremont; Yoshi Tanase, Campbell; Xue-Yu Qian, Milpitas; Arthur H. Sato; Peter Loewenhardt, both of Santa Clara; Yan Ye, Campbell; Shaoher X. Pan, San Jose; Dragan Podlesnik, Palo Alto, all of Calif.

[73] Assignee: Applied Materials, Inc., Santa Clara, Calif.

[21] Appl. No.: 653,212

[22] Filed: May 28, 1996

Related U.S. Application Data

[63] Continuation-in-part of Ser. No. 570,184, Dec. 11, 1995, abandoned.

[51] Int. Cl.$^6$ .................................................. H01J 37/244
[52] U.S. Cl. ................................. 250/397; 250/492.21
[58] Field of Search .............................. 250/397, 398, 250/492.21, 336.1

[56] References Cited

U.S. PATENT DOCUMENTS

| | | | |
|---|---|---|---|
| 4,246,479 | 1/1981 | Gopinathan | 250/305 |
| 4,608,493 | 8/1986 | Hayafuji | 250/397 |
| 4,680,468 | 7/1987 | Bouchard et al. | 250/281 |
| 4,831,267 | 5/1989 | Brunner | 250/397 |
| 4,842,683 | 6/1989 | Cheng et al. | 156/345 |
| 4,849,629 | 7/1989 | Daimon et al. | 250/305 |
| 5,068,539 | 11/1991 | Nogami et al. | 250/492.2 |
| 5,225,024 | 7/1993 | Hanley et al. | 156/345 |
| 5,451,784 | 9/1995 | Loewenhardt et al. | 250/305 |

OTHER PUBLICATIONS

Stenzel et al., "Novel Directional Ion Energy Analyzer", Rev. Sci. Instrum. 53(7), Jul. 1982, pp. 1027–1031.

*Primary Examiner*—Bruce Anderson
*Attorney, Agent, or Firm*—Thomason and Moser

[57] ABSTRACT

Apparatus for measuring plasma characteristics within a semiconductor wafer processing system and a method of fabricating and using the apparatus. The apparatus contains a first insulator layer upon which one or more conductive collector pads are formed by patterning and etching a copper laminate. Each collector pad is connected to a conductive lead (e.g., a printed circuit trace) that extends from each collector pad to the edge of the first insulator layer. A second insulator layer is positioned above the first insulator layer such that the collector pad(s) and their respective lead(s) are sandwiched between the two insulator layers. An adhesive is used to affix the second insulator to the first insulator and the collector pads. The collector pads are exposed to the plasma through apertures defined by the second insulator layer.

25 Claims, 4 Drawing Sheets

L
APPARATUS FOR MEASURING PLASMA CHARACTERISTICS WITHIN A SEMICONDUCTOR WAFER PROCESSING SYSTEM AND A METHOD OF FABRICATING AND USING SAME

CROSS-REFERENCE TO RELATED APPLICATIONS

This application is a continuation-in-part application of U.S. patent application Ser. No. 08/570,184, filed Dec. 11, 1995 abandoned.

BACKGROUND OF THE DISCLOSURE

1. Field of the Invention

The invention relates to test and measurement apparatus for a semiconductor wafer processing system and, more particularly, to apparatus for measuring plasma characteristics including ion current and/or self-bias voltage at one or more locations located within the plasma reaction chamber of a semiconductor wafer processing system.

2. Description of the Background Art

Ion current flux is an important parameter of a plasma generated within a reaction chamber of a semiconductor wafer processing system. This parameter generally defines the effectiveness of the semiconductor wafer processing system in processing a wafer. Specifically, the ion current flux affects the uniformity of the etch process and indicates potential damage to a wafer. Since this parameter is so important to the etch process, the measurement of ion current at various locations within the chamber is important to characterizing the effectiveness of the plasma in processing a wafer.

Another useful parameter that can be used as a gauge of process uniformity is the "self-bias" voltage produced on a wafer during processing. Accurate measurement of the self-bias voltage of a wafer is important to characterizing the effectiveness of the plasma in processing the wafer. Present techniques for measuring ion current flux and self-bias voltage are discussed below.

Typically, to measure the ion current, an ion current probe, similar to a Langmuir probe, is used. FIG. 1 depicts a top plan view of such a probe 100 having a plurality of current collectors 102. FIG. 2 depicts a cross-sectional view of the current probe 100 taken along line 2—2 of FIG. 1. To best understand this prior art current probe 100, the reader should simultaneously refer to FIGS. 1 and 2.

The current collectors are typically fabricated as nickel-plated, copper disks (or some other conductive material). To measure the distribution of current at the surface of a wafer, one or more current collectors 102 are affixed to one surface of a placebo wafer 104, e.g., an anodized aluminum disk having the same size and shape as a semiconductor wafer. The placebo wafer is then positioned within a semiconductor processing system (not shown) in a similar location as a semiconductor wafer would typically be located. Once a plasma is generated by the processing system, the ion current collectors are biased negatively via wires 106 to collect positive ions from the plasma. Consequently, an electric current is produced in the wire attaching each collector to a respective current meter (not shown). The measured current is indicative of the number of ions incident upon the current probe at that location on the placebo wafer. By judiciously positioning the current collectors in an array on the surface of the placebo wafer, the ion currents measured at the different individual current collectors are combined to estimate the ion current distribution over the surface of the placebo wafer. This current distribution is indicative of the ion current flux within the plasma.

However, in such a current probe, the current collectors are generally affixed to the placebo wafer using an adhesive 108 such as glue or epoxy. Such affixation is typically not repeatable from one placebo wafer to another placebo wafer, e.g., each collector may not lie flat against its placebo wafer, the collector may be offset from its previous location on a previously fabricated placebo wafer, and the like, resulting in varied measurements depending on the specific probe used in conducting the measurement and its location within the chamber.

Furthermore, the adhesive used to affix the collectors to the placebo wafer can cause chamber contamination. Also, having an adhesive exposed to the chamber environment causes the adhesive to physically break down. Specifically, the adhesive has a different thermal expansion coefficient than either the placebo wafer or the collectors. As such, the extreme temperature changes that are experienced by the probe within the chamber cause the adhesive to harden and crack, and ultimately, the collectors will dislodge from the placebo wafer.

Additionally, the vertical edges 110 of the collectors 102, which have a thickness of greater than 1 millimeter, are exposed to the plasma. Such exposure enables these edges to collect a substantial number of ions. Consequently, the true area that collects ions is larger than the top surface area of the collector. As such, the current flux computations will be inaccurate.

Furthermore, the top edge of each of the collectors, being a substantial distance (e.g., greater than 1 mm) above the placebo wafer surface, can become charged relative to the placebo wafer surface. As such, a substantial voltage differential forms between the wafer and the collector edge such that arcing may occur. Such arcing is detrimental to the ion current measurements and the integrity of the current probe.

To measure the self-bias voltage on a wafer, a single point voltage probe is typically used. FIG. 6 depicts a conventional voltage probe 600. This probe contains a conductive disk 602 that is exposed to the plasma. The edges 604 of the disk and the conductive lead 606 are isolated from the plasma by a grounded conductive shield 608. The lead 606 is coupled to a resistive load 612 through an inductor 610. A voltage meter 614 measures the voltage across the resistive load 612. The measured voltage represents the self-bias voltage that would develop on a wafer during processing. To achieve an accurate measure of the self-bias voltage, the disk 602 and shield 608 combination is positioned upon the wafer support within the reaction chamber.

One disadvantage of this type of voltage probe is that it only measures the voltage at one location in the chamber. Modern wafers can be 300 mm in diameter and the self-bias voltage can vary substantially across the surface of the wafer. The present probe structure does not provide simultaneous measurement of the self-bias voltage at multiple locations on the wafer support. Additionally, since this form of probe is affixed to the wafer support, and not to a dummy wafer, the probe apparatus is not truly representative of a wafer being processed by the plasma. Thus, the actual self-bias voltage on a wafer may be quite different than that measured by this form of probe.

Therefore, a need exists in the art for apparatus that accurately measures self-bias voltage of a wafer and/or ion current within a semiconductor wafer processing system. Such apparatus requires a repeatable fabrication method, reduced collector sidewall exposure to ions, and reduced risk of arcing.

SUMMARY OF THE INVENTION

The disadvantages heretofore associated with the prior art are overcome by the present invention which is a detector array having one or more ion current collectors and/or self-bias voltage probes fabricated within a structure resembling a printed circuit board (PCB).

Specifically, the present invention is apparatus having a first insulator layer upon which one or more collector pads are formed by patterning and etching a copper laminate. Each collector pad is connected to a conductive lead (e.g., a printed circuit trace) that extends from each collector pad to the edge of the first insulator layer. A second insulator layer is positioned above the first insulator layer such that the collector pad(s) and their respective lead(s) are sandwiched between the two insulator layers. An adhesive is used to affix the second insulator to the first insulator and the collector pads. In operation, the collector pads are exposed to a plasma through apertures defined by the second insulator layer. To measure ion current, the aperture typically has an area of 1 cm$^2$ such that the flux density is easily computed as a number of ions per cm$^2$. To measure self-bias voltage, the aperture typically has a diameter of only 0.18 centimeters (0.07 inches) such that a voltage probe is formed.

To measure ion current within a plasma, the inventive apparatus is positioned within a semiconductor processing system either by affixing the apparatus to a placebo wafer, directly affixing the apparatus to the susceptor (wafer pedestal or support), affixing the apparatus to various locations within the reaction chamber and the like. The aperture through the second insulator layer allows ions from the plasma to impact the collector pad. To attract positive ions from the plasma, the collector pads are typically negatively biased by applying a negative voltage to the leads. The electric currents in the leads due to ions impacting the collectors are measured as an indication of ion current density within the semiconductor wafer processing system.

To measure self-bias voltage generated by the plasma, the inventive apparatus is positioned within a semiconductor processing system by affixing the apparatus to a placebo wafer or directly affixing the apparatus to the susceptor (wafer pedestal or support). The conductive probe that is exposed to the chamber environment through the aperture defined by the second insulator layer charges to a voltage level equivalent to the self-bias voltage that would be experienced by a wafer during processing. The voltage level is measured by a remote voltage meter located outside the chamber.

The collectors are repeatably fabricated within the printed circuit structure by well-known, precision PCB fabrication techniques such that, when affixed to a placebo wafer, the collectors are located at substantially similar locations on the placebo wafer from one wafer to another. Additionally, the printed circuit collectors are relatively thin, such that collection of ions through the sidewalls is significantly reduced as compared to the prior art collectors. As such, the invention substantially improves ion current measurement accuracy over that achieved by the prior art.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
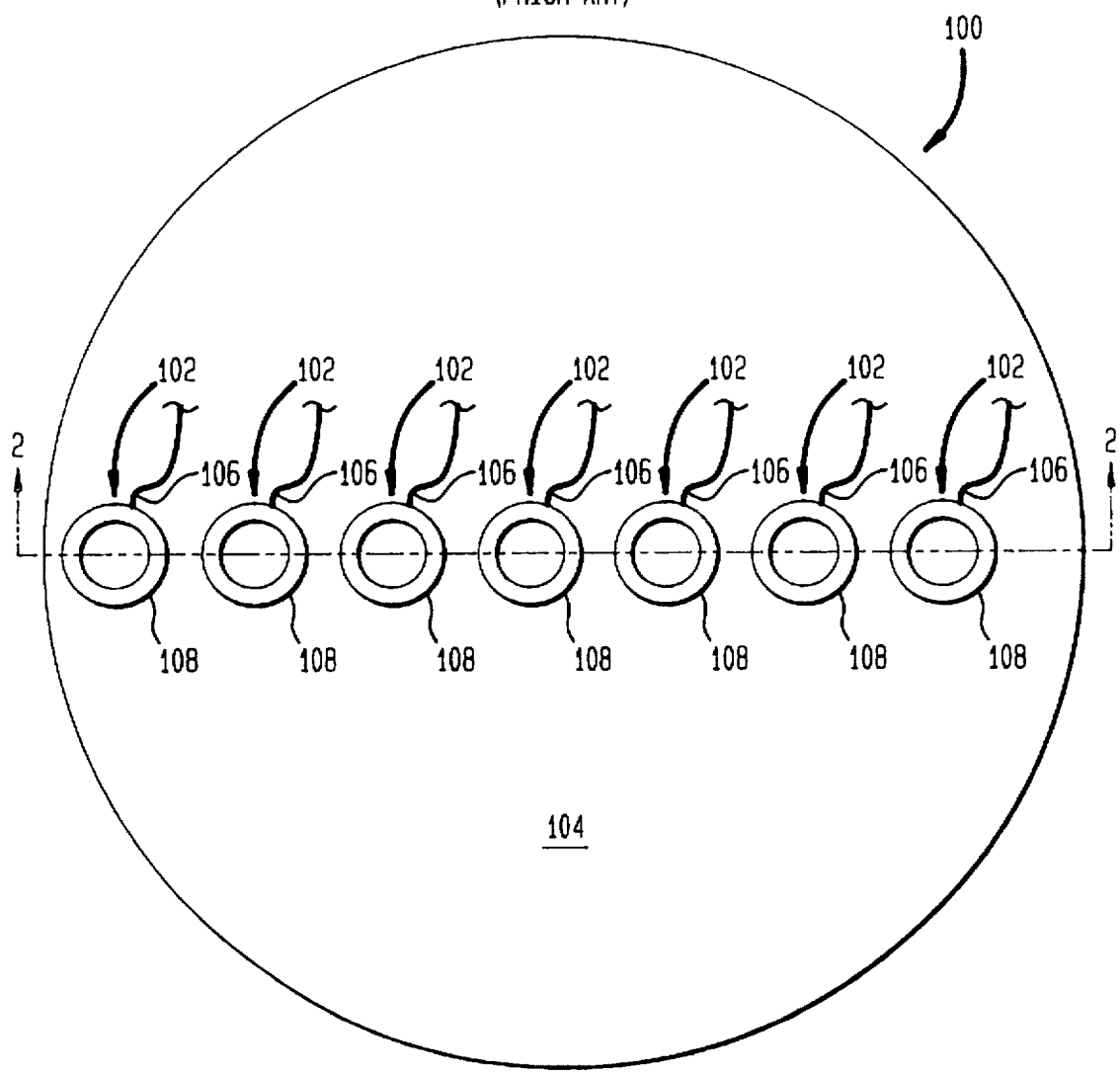
FIG. 1 depicts a top plan view of a prior art diagnostic wafer having a plurality of current collectors affixed to a placebo wafer.
Figure 2:
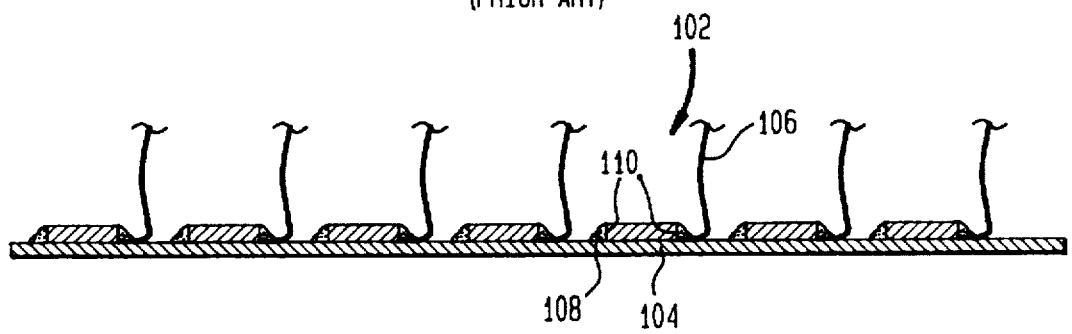
FIG. 2 depicts a cross-sectional view of prior art diagnostic wafer along line 2—2 in FIG. 1.
Figure 3:
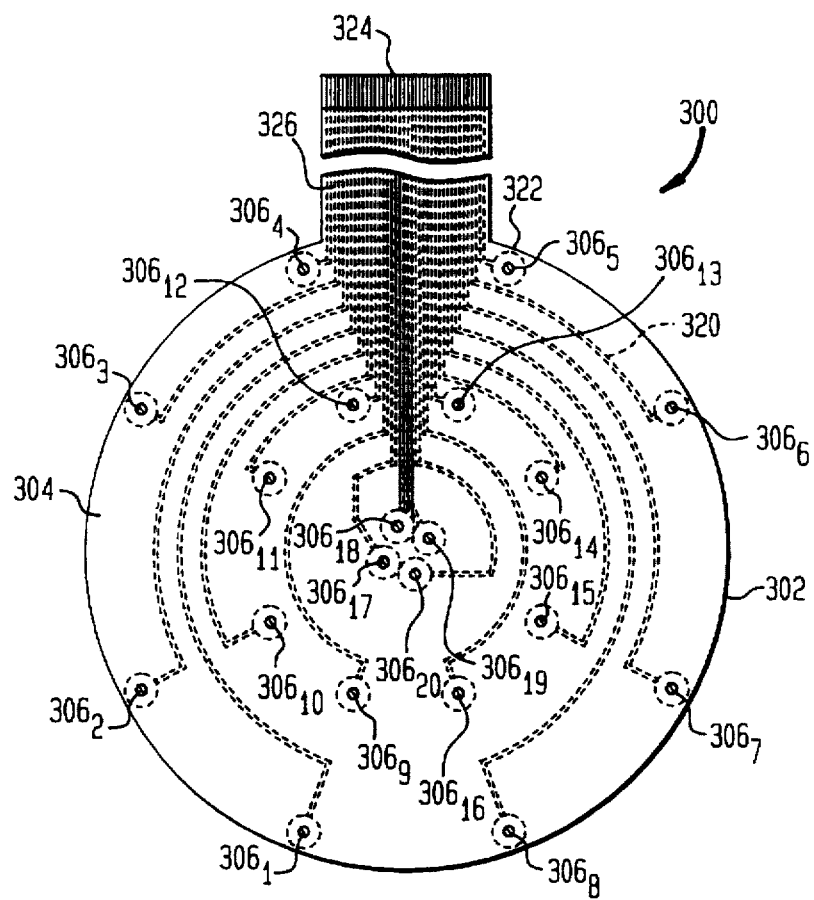
FIG. 3 depicts a top plan view of apparatus for measuring plasma characteristics in accordance with the present invention.

FIG. 3 depicts a top-plan view of apparatus for measuring ion current and/or self-bias voltage in a semiconductor wafer processing system. In the depicted embodiment, the invention is shown in the form of a diagnostic wafer 300 having the inventive apparatus 304 affixed to a placebo (or dummy) wafer 302. However, from the following disclosure those skilled in the art will come to understand that the inventive apparatus can be affixed to many alternative structures such as directly to a susceptor (also known as a wafer pedestal or support), directly to chamber walls, directly to semiconductor wafers, and the like.

Figure 4:
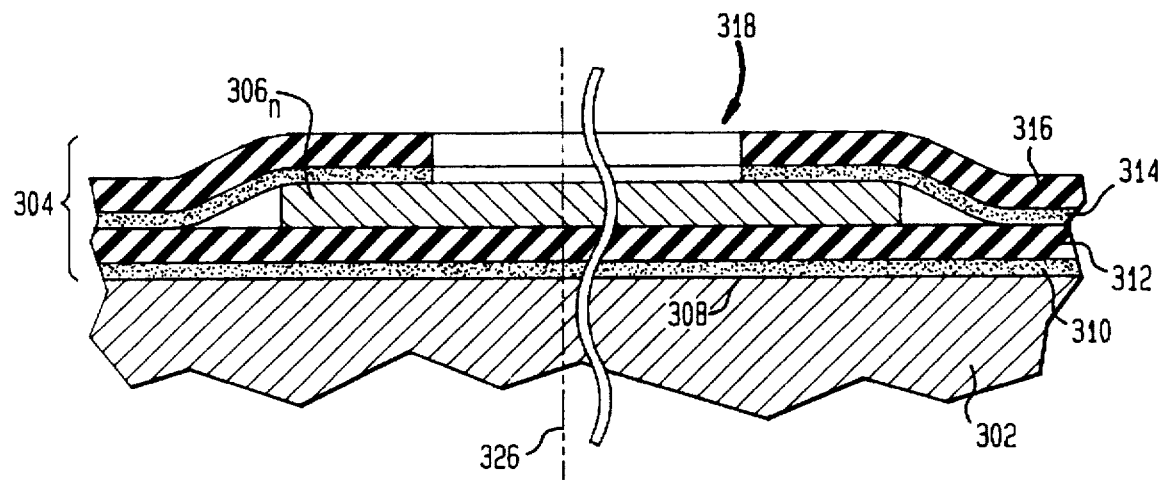
FIG. 4 depicts a cross-sectional view of the apparatus along line 4—4 in FIG. 3.

FIG. 3 depicts a top plan view of the inventive apparatus in the form of a diagnostic wafer 300. FIG. 4 is a cross-sectional view of the diagnostic wafer 300 along line 4—4 shown in FIG. 3. To best understand the invention, the reader should simultaneously consult both FIGS. 3 and 4.

Preferably, the placebo wafer 302 is an anodized aluminum disk or silicon wafer having dimensions equivalent to a semiconductor wafer that it replaces within a semiconductor wafer processing system. In particular, the diameter and thickness of the placebo wafer are the same as a semiconductor wafer to be processed such that the bottom surface of the placebo wafer can be mounted to a chuck or a wafer pedestal within the processing system just as would the process wafer. The chuck then supports the placebo wafer within the processing system in a location that ensures that the placebo wafer experiences the same ion bombardment from a plasma and self-bias voltage as a process wafer would experience in that same location. As such, any measuring instrumentation attached to the placebo wafer measures the environment within the processing system as it would be generated proximate the process wafer. One illustrative semiconductor wafer processing system that can utilize the present invention is a model Centura HDP metal etch system manufactured by Applied Materials, Inc. of Santa Clara, Calif.

By using a placebo wafer to support the inventive apparatus, the wafer heating/cooling techniques normally used by the semiconductor wafer processing system to control wafer temperature can be used to control the probe temperature. For example, to maintain the apparatus of the present invention of a constant temperature, a backside cooling gas, e.g., helium, can be applied to the interstitial space(s) between the placebo wafer and the support surface of the chuck. Generally speaking, since the apparatus mounted to the placebo wafer experiences the same environmental conditions as a wafer when being processed, whatever environmental controls available to adjust the environment surrounding a wafer are applicable to adjusting the environment surrounding the apparatus of the present invention.

The placebo wafer 302 supports the inventive apparatus 304 which contains at least one, but more typically, a plurality of conductive pads $306_n$ (n being an integer value greater than or equal to 1). In the illustrative embodiment, there are twenty collector pads $306_1$ through $306_{20}$. However, those skilled in the art will certainly understand that any number collector pads, may be used to implement the invention. The collector pads are arranged in an array such that the properties of the plasma can best be determined over the entire surface of the wafer. Although a concentric array is depicted, any arrangement of collector pads may be used.

More specifically, upon the placebo wafer 302 is affixed a patterned, copper laminate containing a first insulator layer 312 with copper collector pads $306_n$ patterned thereupon. The laminate is precut to the dimensions of the placebo wafer. The laminate is generally affixed to the wafer 302 using an adhesive 310 such as phenolic butyral. Typically, the first insulator layer covers the top surface 308 of the placebo wafer 302. Atop the first insulator layer are pre-etched, prior to attachment to the placebo wafer, one or more conductive pads 306 and a lead 320 (e.g., a conductive printed circuit trace) that extends from each pad 306 to the edge 322 of the first insulator layer 312 such that electrical contact can be made to the pad via connector tail 326. To facilitate attachment to a feedthrough connector located in a reaction chamber wall, each lead 320 is exposed at end 324 of the tail 326, i.e., the second insulator layer does not extend all the way to end 324. Typically, the pads 306 are disk shaped having a diameter of approximately 1.43 cm (0.564 inches) and an approximate thickness of 37 µm.

The pads and their respective leads are typically fabricated using conventional flexible, printed circuit fabrication techniques. For example, the pads are formed by the following process. A laminate of one ounce copper cladding and the first insulator layer is available from a flexible circuit board manufacturer such as Rogers Corporation of Chandler, Arizona. Specifically, a flexible laminate having a uniform 37 µm thick copper layer over a polyimide insulator sheet that is approximately 50 µm (2 mil) thick can be purchased as model 1100-L-120 from Rogers. The cladding is then masked to outline the collector pad(s) and their associated leads. Lastly, the masked cladding is etched to form the pad(s) and their associated leads. The collector pads are typically plated with nickel to inhibit corrosion in the chlorine atmosphere that may exist within the reaction chamber of the wafer processing system. Once patterned, such a thin collector pad (37 µm) virtually eliminates the possibility for any ions being collected through the edges of the collector pad.

To complete the apparatus, an adhesive (e.g., phenolic butyral in an approximately 25 µm (1 mil) thick layer) is applied to a sheet, hereinafter referred to as the second insulator layer 316. The second insulator layer 316 is then laid upon the first insulator layer 312, with the insulating layer between them, such that the collector pads and their associated leads are sandwiched between the two insulator layers 312 and 316. The flexible nature of the sheet constituting the second insulator layer 316 allows it to adhere to the first insulator layer 312 while rising over the collector pads 306n and possibly adhering to them. The second layer may be an approximately 50 µm (2 mils) thick sheet of polyimide that is sold under the name UPILEX by Rogers as model 100-C-120. UPILEX is a registered trademark of UBE Industries, Ltd. of Yamaguchi, Japan. Furthermore, the second insulator layer 316 contains circular apertures 318 that are aligned with central axes 328 of respective collector pads 306. The apertures 318 are slightly smaller in diameter than the diameter of the underlying collector pad such that the second insulator layer overlaps the circumferential edge of the collector pad so that the exposed area of the pad is approximately 1 $cm^2$ (1.13 cm diameter) for ion collection and/or 0.18 cm (0.07 inch) diameter for self-bias voltage measurement. These apertures 318 are precut (e.g., by drilling) into the second insulating layer before it is affixed to the first insulating layer. The size of the apertures 318 determines the effective areas of the collector pads $306_n$, and drilling tightly controls the aperture diameters. Although disk-shaped collector pads and circular apertures are discussed, the collector pads and the apertures may, of course, be of any shape or dimension. Also, assorted aperture sizes and shapes can be used within a single array to facilitate simultaneous measurement of self-bias voltage and ion current.

The overall thickness of the inventive apparatus 304 is approximately 230 µm (9 mils). The illustrative array of FIG. 3 contains twenty collector pads distributed in concentric rings. There are four inner-most pads evenly distributed along a circle having a diameter of 2.24 cm (0.882 inches). A second set of collector pads, eight middle pads, are evenly distributed at a 45-degree interval along a circle having a diameter of 9.01 cm (3.546 inches). Lastly, a third set of collector pads, eight outer-most pads, are evenly distributed at a 45-degree interval along a circle having a diameter of 18.01 cm (7.090 inches).

As mentioned above, the inventive apparatus, i.e., the first insulator layer, at least one collector pad with its associated lead, and the second insulator layer, can be fabricated independent of the underlying placebo wafer. As such, the inventive apparatus for measuring ion current or self-bias voltage can be adapted for mounting upon any structure, be it the chamber wall, a semiconductor wafer, a wafer pedestal, and the like. Additionally, the apparatus typically uses a flexible insulator as the first and second insulator layers such that the apparatus can be easily bent to approximately conform to the contours of the underlying structure. As such, the apparatus is extremely versatile as to the position within the chamber and the current measurements it is capable of making.

Figure 5:
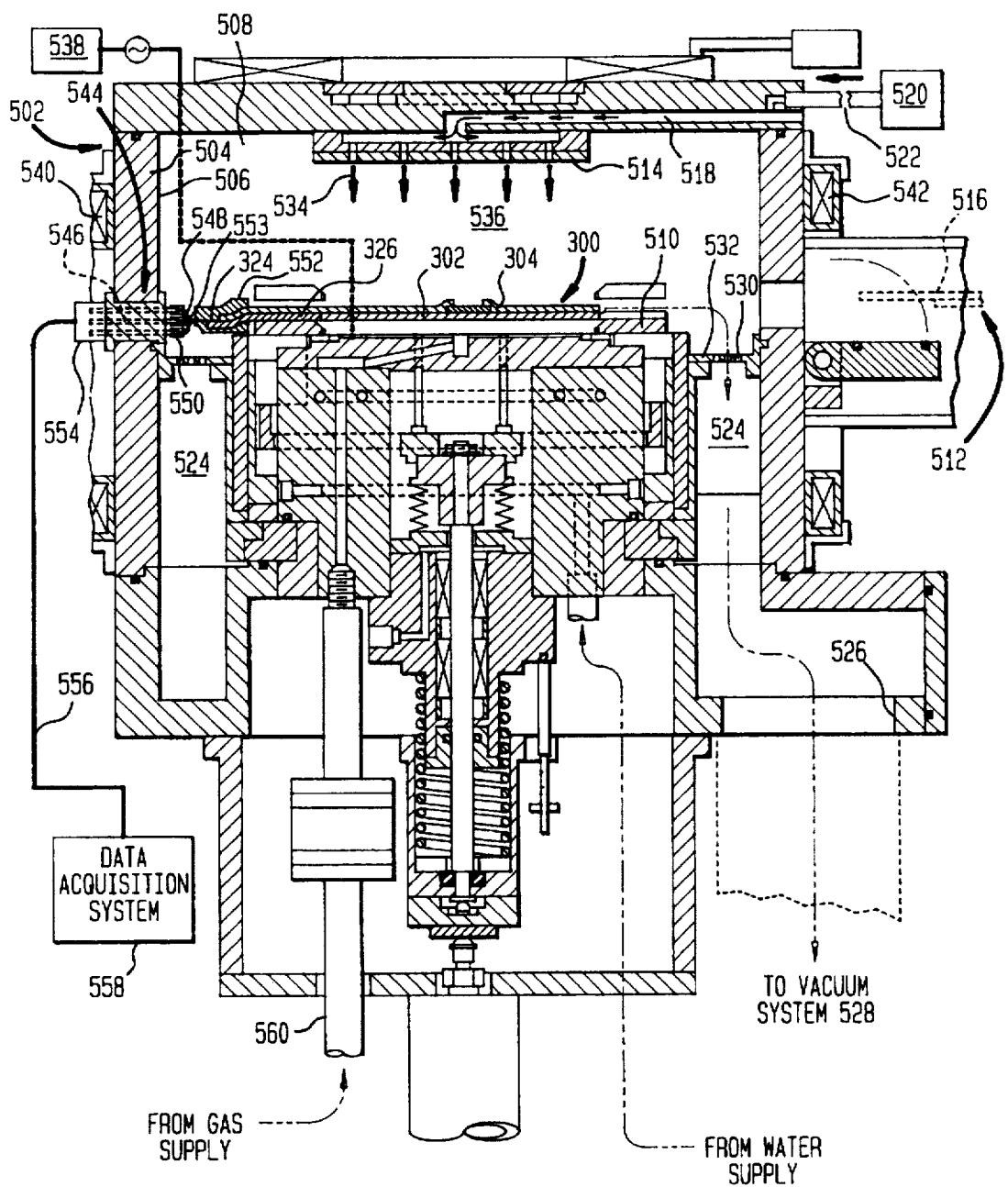
FIG. 5 depicts a cross-sectional view of a semiconductor wafer etching system adapted to incorporate the present invention.
Figure 6:
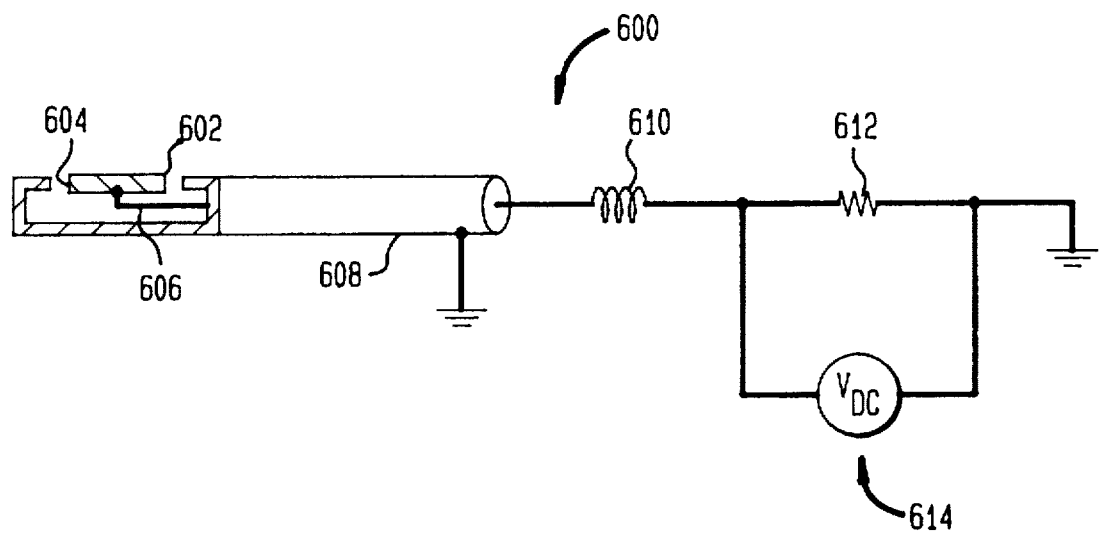
FIG. 6 depicts a schematic view of a prior art self-bias voltage probe.

FIG. 5 depicts an illustrative use for the inventive apparatus within a semiconductor processing system, specifically, a magnetic field-enhanced plasma reactor system 500. Such a system is described in detail in commonly assigned U.S. Pat. No. 4,842,683, issued Jun. 27, 1989, and entitled "Magnetic Field-Enhanced Plasma Reactor"; U.S. Pat. No. 5,225,024, issued Jul. 6, 1993, and entitled "Magnetically Enhanced Plasma Reactor System"; and U.S. patent application Ser. No. 08/431,178, filed Apr. 28, 1995, and entitled "Method and Apparatus for Producing Plasma Uniformity in a Field Enhanced Plasma Reactor". The patents and the application are incorporated herein by reference.

Specifically, the system 500 comprises a housing 502 having octagon-shaped outer walls 504 and a circular inner wall 506 defining a reaction chamber 508. The system also includes a gas and liquid cooled pedestal/cathode assembly 510 and a wafer (substrate) exchange system 512. The wafer exchange system 512 cooperates with the pedestal assembly 510 to facilitate positioning a process wafer 516 upon assembly 510 and removing the process wafer 516 from the chamber 508 after etching.

A gas supply system 520 supplies, via a gas manifold 514, process gases to the interior of the chamber 508. The gas supply system 520 communicates with the manifold 514 and chamber 508 via supply line 522 and conduit 518.

Vacuum is supplied to the chamber and spent gases are exhausted via annular exhaust chamber 524 communicating with exhaust port 526 connected to a vacuum pumping system 528. The exhaust flow is directed from the chamber 508 through holes 530 in a horizontal annular plate 532 mounted about the upper periphery of the cathode assembly 510. The plate 530 inhibits plasma penetration into the annular exhaust chamber 524.

Conduit 518 routes a reactant gas such as carbon tetraflouride ($CF_4$) from supply line 522 into manifold 514. The gas exits the manifold downwardly (as indicated by arrows 534). When RF power is applied to the cathode assembly 510 an etching plasma is formed in chamber processing region 536. An RF power supply system 538 supplies RF power to the reactor system 500 to generate the plasma.

To control the plasma, the reactor system 500 further includes a number of paired electromagnets 540 and 542 typically comprising copper coils, mounted in a rectangular array, one each on alternating outer walls of the octagon-shaped housing 504.

The remaining component parts of the reactor system depicted in FIG. 5 form an operational reactor system in which the present invention is incorporated. A full discussion of all the component parts is presented in commonly assigned Pat.s and application referred to above and incorporated herein by reference.

To measure an ion current and/or self-bias voltage distribution within the chamber 508, the diagnostic wafer 300 (i.e., the inventive apparatus 304 affixed to a placebo wafer 302) is positioned upon the pedestal assembly 510 in the usual position of a process wafer. The connector tail 326 extends from the collector pads toward the feedthrough connector 544. The feedthrough connector 544 is vacuum sealed to a chamber wall 504. An illustrative feedthrough is manufactured as model K150-IF20-S by MDC Vacuum Products Corporation of Hayward, Calif. Each conductive lead 546 of the feedthrough connector 544 is terminated inside the chamber with a crimp socket. Each of the exposed ends of the leads of the ion current detector 304 are soldered to one end of a Kapton covered wire 548. Each wire 548 is terminated with a crimp pin that mates with a crimp socket 550 of the feedthrough connector. To ensure that ions do not impact the crimp connection, each of the crimp connections to the individual feedthrough leads is covered with heat-shrink tubing 553.

Also, ions from the plasma must not impact the solder joints connecting the wires 548 to the connector tail 326. As such, a cover 552, manufactured of a high temperature plastic known as Vespel, encloses the solder joints connecting the wires to the connector tail.

The end of the feedthrough connector that is external to the chamber 508 is adapted to receive a plug connector 554. The plug connector attaches a plurality of leads 556 to the leads 550 of the feedthrough 544. The leads 556 are terminated at a data acquisition system 558 that, when measuring ion current, applies a bias voltage to the leads, measures the current carried by each of the leads 556 and generates an ion current distribution from those measured currents. When measuring self-bias voltage, the system 558 measures the voltage at each collector pad and generates a voltage distribution profile from the measured voltages. An applicable data collection, analysis and display system is disclosed in commonly assigned U.S. patent application Ser. No. 08/621, 279, filed Mar. 22, 1996, herein incorporated by reference.

In operation, the detector apparatus 304 mounted upon a placebo wafer 302 is positioned in the chamber 508 upon the pedestal 510 and the detector 304 is attached to the feedthrough connector 544 as discussed above. If the pedestal contains an electrostatic chuck, the chuck is powered to retain the placebo wafer on the pedestal. The reactant gas is supplied to the chamber via conduit 518 and manifold 514, while backside cooling gas is supplied via conduit 506 to the backside of the placebo wafer 302. The RF source 538 then applies power to the pedestal to strike a plasma within region 536. When measuring ion current, the data acquisition system provides a negative bias voltage to the collector pads via wires 556, connector leads 546, wires 548 and leads 320. Ions within the plasma impact the collector pads $306_n$ and produce currents in the leads 320. Data acquisition system 558 measures these currents and generates a current distribution that represents the plasma flux proximate the ion detector apparatus 304. When measuring self-bias voltage, the plasma charges the placebo wafer and its collector pads and the voltage on the collector pads is measured by the data acquisition system 558. The system 558 then generates a self-bias voltage distribution that represents the self-bias voltage across the surface of the placebo wafer.

The specific materials discussed above are to be considered illustrative of one embodiment of the invention. Other materials may be substituted for those described. The choice of materials is typically defined by the environment in which the probe will be used, e.g., the temperature and chemicals to which the probe apparatus is exposed when used within the chamber of the semiconductor wafer processing system. For example, the insulator layers can be fabricated from inflexible insulating materials as well as other flexible materials. Also, various other conductive materials can be used as the collector pads, leads and plating including silver, gold, tungsten, and the like.

The inventive apparatus can be fabricated using mass production techniques such that each probe assembly is substantially identical to other probe assemblies of the same design. As such, measurements made with such probe assemblies would be repeatable. Also, the versatile nature of the inventive apparatus enables it to be used in a variety of applications and enable the apparatus to be easily tailored to the specific environment into which it will be used to make measurements. Additionally, the printed circuit collectors are relatively thin, such that collection of ions through the collector sidewalls is significantly reduced as compared to the prior art collectors. As such, the invention substantially improves ion current measurement accuracy over that achieved by the prior art.

Although various embodiments which incorporate the teachings of the present invention have been shown and a described in detail herein, those skilled in the art can readily devise many other varied embodiments that still incorporate these teachings.

What is claimed is:

1. Apparatus for measuring plasma characteristics comprising:
   a planar first insulator layer;
   a collector pad supported by said planar first insulator layer; and
   a second insulator layer, affixed to said planar first insulator layer and said collector pad, defining an aperture that opens to said collector pad and permits plasma to contact said collector pad.

2. The apparatus of claim 1 comprising a placebo wafer for supporting said planar first insulator layer.

3. The apparatus of claim 1 further comprising a plurality of said collector pads arranged in an array, each having an associated aperture defined by said second insulator layer.

4. The apparatus of claim 3 wherein each of said collector pads is connected to a conductive lead.

5. The apparatus of claim 1 further comprising a conductive lead connected to said collector pad and extending to an edge of said planar first insulator layer.

6. The apparatus of claim 1 wherein said collector pad has a circular plan form.

7. The apparatus of claim 1 wherein said collector pad is nickel plated.

8. The apparatus of claim 1 wherein the planar first insulator layer and second insulator layer are flexible.

9. The apparatus of claim 1 wherein said plasma characteristic is ion current and said aperture permits ions to impact said collector pad.

10. The apparatus of claim 1 wherein said plasma characteristic is self-bias voltage and said aperture permits said collector pad to attain a self-bias voltage.

11. The apparatus of claim 1 wherein said plasma characteristic is ion current and said aperture permits ions to impact said collector pad.

12. The apparatus of claim 1 wherein said plasma characteristic is self-bias voltage and said aperture permits said collector pad to attain a self-bias voltage.

13. Apparatus for measuring plasma characteristics comprising:

a planar first insulator layer;

a plurality of collector pads supported by said planar first insulator layer;

a plurality of conductive leads, where each conductive lead in said plurality of conductive leads is connected to one collector pad in said plurality of collector pads; and a second insulator layer, affixed to said planar first insulator layer, said plurality of collector pads and said plurality of conductive leads, and defining a plurality of apertures, where each aperture opens to each of said collector pads.

14. The apparatus of claim 13 comprising a placebo wafer for supporting said planar first insulator layer.

15. The apparatus of claim 13 wherein said plurality of conductive leads extends from each of said collector pads to an edge of said planar first insulator layer.

16. The apparatus of claim 13 wherein at least one of said collector pads in said plurality of collector pads has a circular plan form.

17. The apparatus of claim 13 wherein at least one of said collector pads in said plurality of collector pads is nickel plated.

18. The apparatus of claim 13 wherein the planar first insulator layer and second insulator layer are flexible.

19. A method of measuring ion current within a reaction chamber of a semiconductor wafer processing system comprising the steps of:

positioning apparatus for measuring ion current within a reaction chamber, where said apparatus for measuring ion current comprises a planar first insulator layer, a collector pad supported by said planar first insulator layer, and a second insulator layer, affixed to said planar first insulator layer and said collector pad, said second insulator layer defines an aperture that opens to said collector pad and permits ions to impact said collector pad;

connecting, via a conductive path, said collector pad to a data acquisition system;

striking a plasma within said reaction chamber; and measuring, with said data acquisition system, current within said conductive path produced by ions impacting said collector pad.

20. The method of claim 19 further comprising the step of supplying a bias voltage to said conductive pad.

21. The method of claim 19 wherein said apparatus is affixed to a placebo wafer and the method further comprises the step of positioning the placebo wafer upon a pedestal within the reaction chamber.

22. The method of claim 19 wherein said apparatus further comprises a plurality of said collector pads arranged in an array, each having an associated aperture defined by said second insulator layer, and each conductive pad in said plurality of conductive pads is connected, via a conductive path, to the data acquisition system.

23. A method of measuring self-bias voltage within a reaction chamber of a semiconductor wafer processing system comprising the steps of:

positioning apparatus for measuring self-bias voltage within a reaction chamber, where said apparatus for measuring self-bias voltage comprises a planar first insulator layer, a collector pad supported by said planar first insulator layer, and a second insulator layer, affixed to said planar first insulator layer and said collector pad, said second insulator layer defines an aperture that opens to said collector pad and permits a plasma to contact said collector pad;

connecting, via a conductive path, said collector pad to a data acquisition system;

striking a plasma within said reaction chamber; and measuring, with said data acquisition system, voltage on said collector pad produced by said plasma contacting said collector pad.

24. The method of claim 23 wherein said apparatus is affixed to a placebo wafer and the method further comprises the step of positioning the placebo wafer upon a pedestal within the reaction chamber.

25. The method of claim 23 wherein said apparatus further comprises a plurality of said collector pads arranged in an array, each having an associated aperture defined by said second insulator layer, and each conductive pad in said plurality of conductive pads is connected, via a conductive path, to the data acquisition system.

* * * * *